(12) United States Patent
Lee

(10) Patent No.: US 8,169,840 B2
(45) Date of Patent: May 1, 2012

(54) ADDRESS LATCH CIRCUIT AND SEMICONDUCTOR MEMORY APPARATUS USING THE SAME

(75) Inventor: Sang-Hee Lee, Ichon (KR)

(73) Assignee: Hynix Semiconductor Inc. (KP)

( * ) Notice: Subject to any disclaimer, the term of this patent is extended or adjusted under 35 U.S.C. 154(b) by 643 days.

(21) Appl. No.: 12/346,982

(22) Filed: Dec. 31, 2008

(65) Prior Publication Data
US 2010/0034035 A1     Feb. 11, 2010

(30) Foreign Application Priority Data
Aug. 8, 2008   (KR) .................. 10-2008-0077693

(51) Int. Cl.
*G11C 7/22*     (2006.01)
*G11C 8/18*     (2006.01)
*G11C 8/00*     (2006.01)

(52) U.S. Cl. ............ 365/193; 365/233.1; 365/230.08

(58) Field of Classification Search .............. 365/230.8, 365/233.1, 193, 194
See application file for complete search history.

(56) References Cited

U.S. PATENT DOCUMENTS

| | | | |
|---|---|---|---|
| 5,999,472 A * | 12/1999 | Sakurai | ............ 365/222 |
| 6,249,463 B1 | 6/2001 | Pascucci | |
| 7,215,594 B2 | 5/2007 | Im et al. | |
| 7,227,811 B2 | 6/2007 | Cho | |
| 7,715,270 B2 * | 5/2010 | Lee | ............ 365/230.08 |
| 2007/0002637 A1 * | 1/2007 | Jang et al. | ............ 365/189.05 |

FOREIGN PATENT DOCUMENTS

| | | |
|---|---|---|
| JP | 06275071 | 9/1994 |
| KR | 1019940004642 | 3/1994 |
| KR | 100211483 | 5/1999 |
| KR | 1020010047537 | 6/2001 |

* cited by examiner

*Primary Examiner* — Huan Hoang
*Assistant Examiner* — Tri Hoang
(74) *Attorney, Agent, or Firm* — Baker & McKenzie LLP

(57) ABSTRACT

An address latch circuit of a semiconductor memory apparatus includes a control signal generating section configured to generate a control signal in response to an external command signal and a RAS idle signal, a clock control section configured to output a clock signal as a control clock signal when the control signal is enabled and to fix the control clock signal to a predetermined level when the control signal is disabled, and an address latch section configured to latch an address signal in response to the control clock signal.

20 Claims, 4 Drawing Sheets

US 8,169,840 B2

ADDRESS LATCH CIRCUIT AND SEMICONDUCTOR MEMORY APPARATUS USING THE SAME

CROSS-REFERENCES TO RELATED PATENT APPLICATION

The present application claims priority under 35 U.S.C. §119(a) to Korean Patent Application No. 10-2008-0077693, filed on Aug. 8, 2008, in the Korean Intellectual Property Office, which is incorporated herein by reference in its entirety as if set forth in full.

BACKGROUND

1. Technical Field

The embodiments described herein relate to a semiconductor memory apparatus, and more particularly, to an address latch circuit and a semiconductor memory apparatus using the same.

2. Related Art

In general, a semiconductor memory apparatus operates in synchronization with clock signals. Accordingly, an address signal input to the semiconductor memory apparatus is input in synchronization with the clock signals.

FIG. 1 is a schematic diagram a conventional address latch circuit of a semiconductor memory apparatus. In FIG. 1, an address latch circuit 1 of a semiconductor memory apparatus includes first to third inverters IV1 to IV3, a control inverter IVC1, and first to fourth transistors P1, P2, N1, and N2. The first inverter IV1 receives a clock signal 'CLK', and the second inverter IV2 receives an output signal of the first inverter IV1. The first transistor P1 receives the output signal of the first inverter IV1 at a gate terminal thereof and receives an external voltage VDD at a source terminal thereof. The second transistor P2 receives an address signal 'add' at a gate terminal thereof and is connected to a drain terminal of the first transistor P1 at a source terminal thereof. The third transistor N1 receives the address signal 'add' at a gate terminal thereof and is connected to a drain terminal of the second transistor P2 at a drain terminal thereof. The fourth transistor N2 receives an output of the second inverter IV2 at a gate terminal thereof, is connected to a source terminal of the third transistor N1 at a drain terminal thereof, and is connected to a ground terminal VSS at a source terminal thereof.

The third inverter IV3 has an input terminal which is connected with a node connected to the second transistor P2 and the third transistor N1, and outputs a latch signal 'latch_s' at an output terminal thereof. The control inverter IVC1 has an input terminal connected to the output terminal of the third inverter IV3, an output terminal connected to the input terminal of the third inverter IV3, a first control terminal receiving the output signal of the second inverter IV2, and a second control terminal receiving the output signal of the first inverter IV1.

In FIG. 1, the first transistor P1 and the fourth transistor N2 are turned ON when the clock signal 'CLK' is at a high level. When the first and fourth transistors P1 and N2 are turned ON, the address signal 'add' is inverted and input to the third inverter IV3. The third inverter IV3 inverts the inverted address signal 'add' to output it as the latch signal 'latch_s'.

Conversely, the first and fourth transistors P1 and N2 are turned OFF when the clock signal 'CLK' is at a low level. The address signal 'add' is not inverted and is not input to the third inverter IV3. However, since the control inverter IVC1 is turned ON when the clock signal 'CLK' is at the low level, a latch structure of the third inverter IV3 and the control inverter IVC1 is formed. Accordingly, the latch signal 'latch_s' output when the clock signal 'CLK' is at the high level is stored by the latch structure of the third inverter IV3 and the control inverter IVC1, thereby maintaining the high level.

In FIG. 1, the address latch circuit continuously operates in synchronization with the clock signals regardless of a change in a state of the semiconductor memory apparatus. For example, when an all-bank precharge command of precharging all banks of the semiconductor memory apparatus is input, all the banks are precharged. In the all-bank precharge state, address information is not required. However, since the address latch circuit continuously operates in synchronization with the clock signals, the address latch circuit generates unnecessary current consumption. In particular, current consumption by the elements IV1, IV2, IVC1, P1, and N2, which are repetitively turned ON and OFF in response to the clock signals shown in FIG. 1, is the largest.

SUMMARY

An address latch circuit capable of reducing current consumption and a semiconductor memory apparatus using the same are described herein.

In one aspect, an address latch circuit of a semiconductor memory apparatus includes a control signal generating section configured to generate a control signal in response to an external command signal and a RAS idle signal, a clock control section configured to output a clock signal as a control clock signal when the control signal is enabled and to fix the control clock signal to a predetermined level when the control signal is disabled, and an address latch section configured to latch an address signal in response to the control clock signal.

In another aspect, a semiconductor memory apparatus includes a transition control section configured to fix a clock signal to a predetermined level to output the fixed clock signal as a control clock signal when an all-bank precharge command is input, and an address latch section configured to latch an address signal in response to an output of the transition control section.

In another aspect, an address latch circuit of a semiconductor memory apparatus includes a decoding unit generating a decoding signal by decoding a chip selection signal, a low address strobe signal, and a write enable signal, a pulse generating unit generating a pulse signal when the decoding signal is enabled, a signal combining unit enabling a control signal when the pulse signal is disabled and an RAS idle signal is enabled, and to disable the control signal when the pulse signal is enabled, an initialization unit disabling the control signal in response to a power-up signal, a latch unit latching the control signal, a clock control section configured to output a clock signal as a control clock signal when the control signal is enabled and to fix the control clock signal to a predetermined level when the control signal is disabled, and an address latch section configured to latch an address signal in response to the control clock signal.

These and other features, aspects, and embodiments are described below in the section "Detailed Description."

BRIEF DESCRIPTION OF THE DRAWINGS

Features, aspects, and embodiments are described in conjunction with the attached drawings, in which.

DETAILED DESCRIPTION

Figure 2:
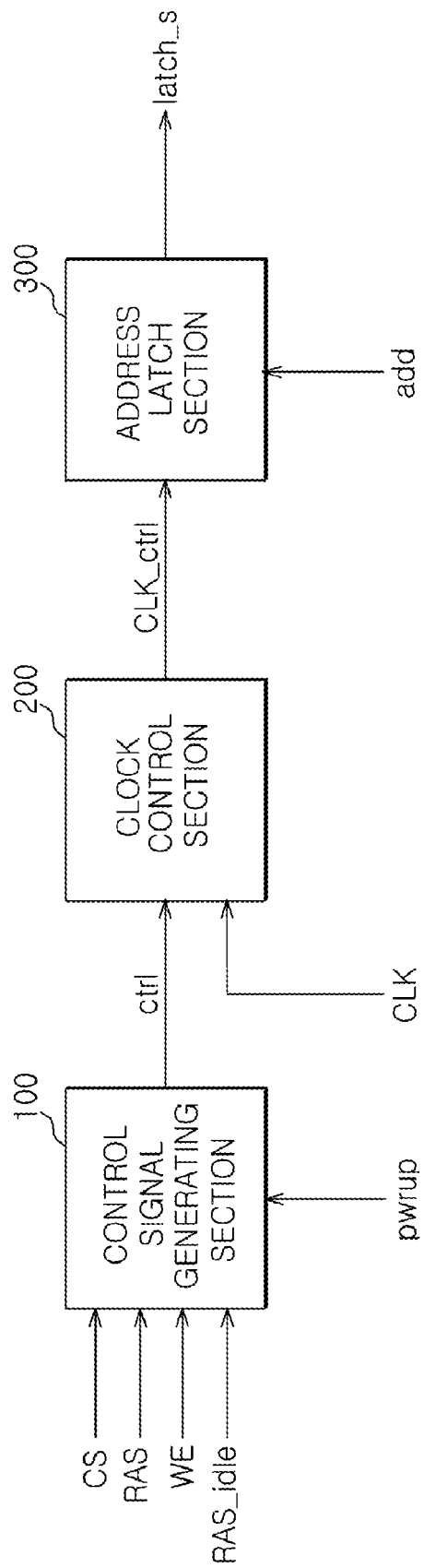
FIG. 2 is a schematic diagram of an exemplary address latch circuit of a semiconductor memory apparatus according to one embodiment.

FIG. 2 is a schematic diagram of an exemplary address latch circuit 2 of a semiconductor memory apparatus according to one embodiment. In FIG. 2, the address latch circuit 2 of a semiconductor memory apparatus can be configured to include a control signal generating section 100, a clock control section 200, and an address latch section 300.

The control signal generating section 100 can generate a control signal 'ctrl' in response to external command signals, such as '/CS', '/RAS', and '/WE', and an RAS idle signal '/RAS_idle'. For example, the external command signals '/CS', '/RAS', and '/WE' can include a chip selection signal '/CS', a low address strobe signal '/RAS', and a write enable signal '/WE'.

The clock control section 200 can output a clock signal 'CLK' as a control clock signal 'CLK_ctrl' when the control signal 'ctrl' is enabled and can fix the control clock signal 'CLK_ctrl' to a specific level when the control signal 'ctrl' is disabled. In addition, the address latch section 300 can latch an address signal 'add' in response to the control clock signal 'CLK_ctrl'.

In FIG. 2, the control signal generating section 100 can enable the control signal 'ctrl' when both the chip selection signal '/CS' and the low address strobe signal '/RAS' are enabled or when both the chip selection signal '/CS' and the write enable signal '/WE' are enabled. The control signal generating section 100 can disable the control signal 'ctrl' when the RAS idle signal '/RAS_idle' is disabled.

Figure 3:
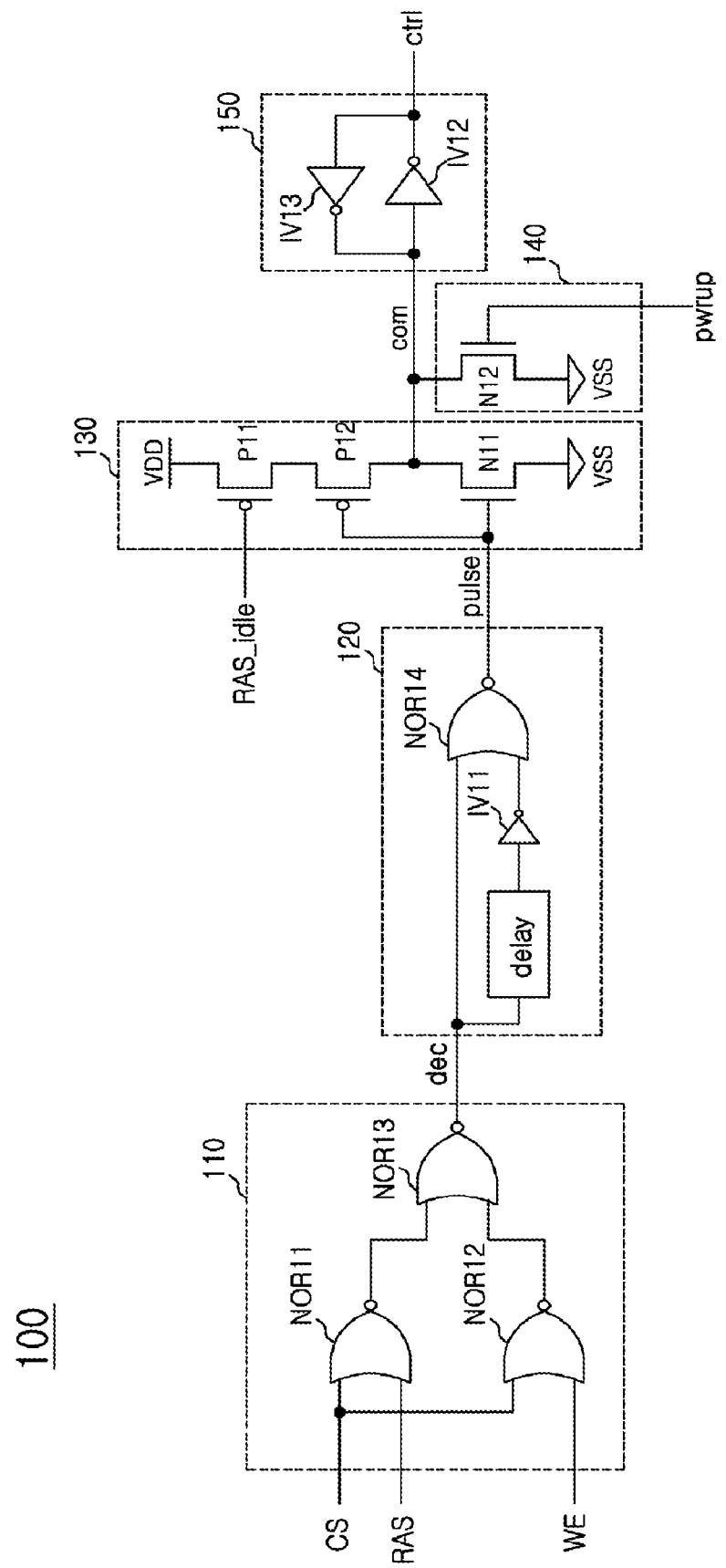
FIG. 3 is a schematic diagram of an exemplary control signal generating section capable of being implemented in the circuit of FIG. 2 according to one embodiment.

FIG. 3 is a schematic diagram of an exemplary control signal generating section 100 capable of being implemented in the circuit of FIG. 2 according to one embodiment. In FIG. 3, the control signal generating section 100 can include a decoding unit 110, a pulse generating unit 120, and a signal combining unit 130.

The decoding unit 110 can enable a decoding signal 'dec' to a low level when both the chip selection signal '/CS' and the low address strobe signal '/RAS' are enabled or when both the chip selection signal '/CS' and the write enable signal '/WE' are enabled. For example, the decoding unit 110 can include first, second, and third NOR gates NOR11, NOR12, and NOR13. The first NOR gate NOR11 can receive the chip selection signal '/CS' and the low address strobe signal '/RAS'. The second NOR gate NOR12 can receive the chip selection signal '/CS' and the write enable signal '/WE'. The third NOR gate NOR13 can receive output signals of the first and second NOR gates NOR11 and NOR12 to output the decoding signal 'dec'.

The pulse generating unit 120 can generate a pulse signal 'pulse' enabled to a high level when the decoding signal 'dec' is enabled to the low level. For example, the pulse generating unit 120 can include a delay unit, a first inverter IV11, and a fourth NOR gate NOR14, wherein the delay unit delay can receive the decoding signal 'dec'. The first inverter IV11 can receive an output signal of the delay unit, and the fourth NOR gate NOR14 can receive the decoding signal 'dec' and an output signal of the first inverter IV11 to generates the pulse signal 'pulse'.

The signal combining unit 130 can enable a combination signal 'com' to the high level when the pulse signal 'pulse' is disabled to the low level and the RAS idle signal '/RAS_idle' is enabled to the low level. Accordingly, the signal combining unit 130 can disable the combination signal 'com' to the low level when the pulse signal 'pulse' is enabled to the high level. For example, the signal combining unit 130 can include first, second, and third transistors P11, P12, and N11. The first transistor P11 can receives the RAS idle signal '/RAS_idle' at a gate terminal thereof and can receive an external voltage VDD at a source terminal thereof. The second transistor P12 can receive the pulse signal 'pulse' at a gate terminal thereof and can be connected to a drain terminal of the first transistor P11 at a drain terminal thereof. The third transistor N11 can receive the pulse signal 'pulse' at a gate terminal thereof, can be connected to a source terminal of the second transistor at a drain terminal thereof, and can be connected to a ground terminal VSS at a source terminal thereof. Here, the RAS idle signal '/RAS_idle' can be a signal enabled when an all-bank precharge command is input to the semiconductor memory apparatus, wherein all banks can be precharged. The combination signal 'com' can be output from a node connected with the second transistor P12 and the third transistor N11.

The control signal generating section 100 can further include an initialization unit 140 and a latch unit 150. The initialization unit 140 can initialize the combination signal 'com' to a low level in response to a power-up signal 'pwrup'.

The initialization unit 140 can include a fourth transistor N12 that can receive the power-up signal 'pwrup' at a gate terminal thereof, can be connected to an output terminal of the signal combining unit 130 at a drain terminal thereof, and can be connected to a ground terminal VSS at a source terminal thereof.

The latch unit 150 can invert the combination signal 'com' to output it as the control signal 'ctrl'. For example, the latch unit 150 can include second and third inverters IV12 and IV13. The second inverter IV12 can invert the combination signal 'com' to output it as the control signal 'ctrl; and the third inverter IV13 can receive an output signal of the second inverter IV12 to output it to the second inverter IV12.

The clock control section 200 can output the clock signal 'CLK' as the control clock signal 'CLK_ctrl' when the control signal 'ctrl' is enabled to the high level, and can fix the control clock signal 'CLK_ctrl' to the low level when the control signal 'ctrl' is disabled to the low level.

Figure 4:
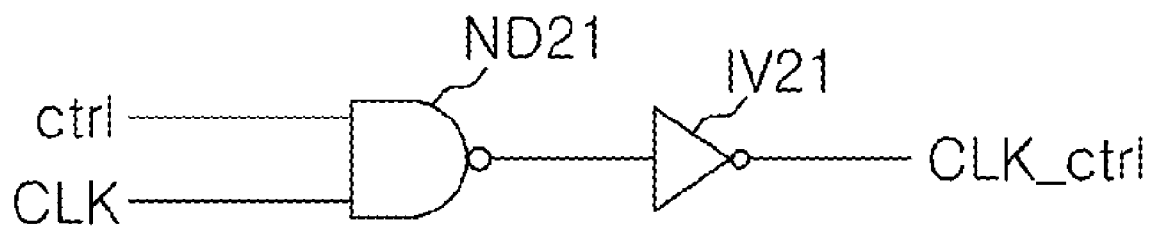
FIG. 4 is a schematic diagram of an exemplary clock control section capable of being implemented in the circuit of FIG. 2 according to one embodiment.

FIG. 4 is a schematic diagram of an exemplary clock control section 200 capable of being implemented in the circuit of FIG. 2 according to one embodiment. In FIG. 4, the clock control section 200 can include a NAND gate ND21 and a fourth inverter IV21. The NAND gate ND21 can receive the clock signal 'CLK' and the control signal 'ctrl'. The fourth inverter IV21 can receive an output signal of the NAND gate ND21 to output it as the control clock signal 'CLK_ctrl'.

Figure 1:
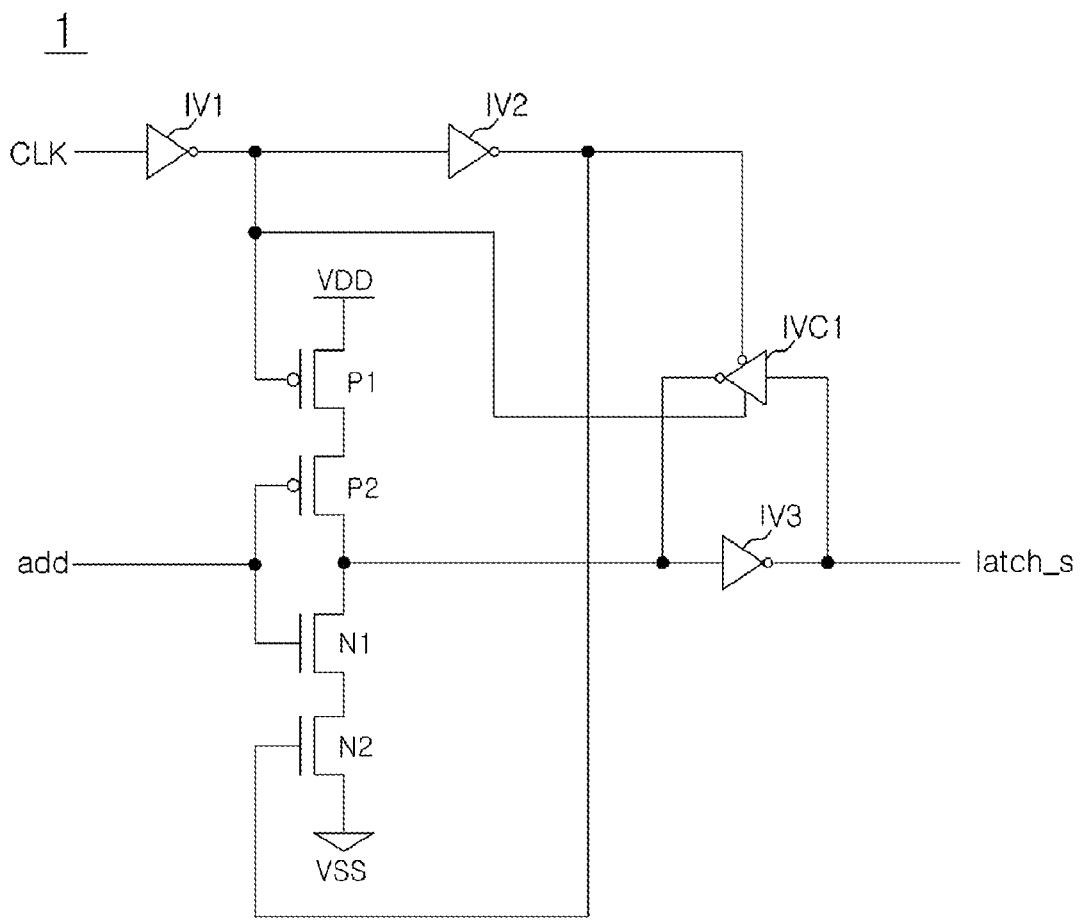
FIG. 1 is a schematic diagram a conventional address latch circuit of a semiconductor memory apparatus.

An exemplary operation of the address latch section 300 will be described with reference to FIG. 1. In FIG. 1, the address latch section 300 can receive the control clock signal 'CLK_ctrl' instead of the clock signal 'CLK'.

When the control clock signal 'CLK_ctrl' is at the high level, the transistors P1 and N2 can be turned ON and the address signal 'add' can be output as a latch signal 'latch_s'. Conversely, when the control clock signal 'CLK_ctrl' is at the low level, the transistors P1 and N2 can be turned OFF, whereby the address signal 'add' is not output as the latch signal 'latch_s'. However, the level of the latch signal 'latch_s' when the control clock signal 'CLK_ctrl' is at the high level can be maintained.

An exemplary operation of the address latch circuit 2 (in FIG. 2) of a semiconductor memory apparatus will be described with reference to FIG. 2.

When the all-bank precharge command is input to the semiconductor memory apparatus, all the banks can be precharged. Accordingly, when all the banks are precharged, the RAS idle signal '/RAS_idle' can be enabled to the low level.

Next, the control signal generating section 100 can receive the RAS idle signal '/RAS_idle' enabled to the low level to generate the combination signal 'com' of the high level. In addition, the control signal generating section 100 can invert the combination signal 'com' of the high level to output the control signal 'ctrl' disabled to the low level.

Then, the clock control section 200 can receive the control signal 'ctrl' disabled to the low level to fix the control clock signal 'CLK_ctrl' to the low level. Next, the address latch section 300 can receive the control clock signal 'CLK_ctrl' fixed to the low level to allow a control inverter IVC1 to be turned ON and can allow the turned-ON control inverter IVC1 and the inverter IV3 to maintain the level of the latch signal 'latch_s'.

When a mode register setting command, a refresh command, an active command, and a ZQ calibration command are input in the semiconductor memory apparatus, the address latch circuit 1 has to generate the latch signal 'latch_s' according to the address signal 'add'.

The semiconductor memory apparatus recognizes the chip selection signal '/CS', the low address strobe signal '/RAS', a column address strobe signal '/CAS', and the write enable signal '/WE' as the mode register setting command when the signals '/CS', '/RAS', '/CAS', and '/WE' are low, low, low, and low, respectively. The semiconductor memory apparatus recognizes the signals '/CS', '/RAS', '/CAS', and '/WE' as the refresh command when the signals '/CS', '/RAS', '/CAS', and '/WE' are low, low, low, high, respectively, as the active command when the signals '/CS', '/RAS,' '/CAS', and '/WE' are low, low, high, and high, respectively, and the ZQ calibration command when the signals '/CS', '/RAS,' '/CAS', and '/WE' are low, high, high, and low, respectively. In consideration of the logic values, the mode register setting command, the refresh command, the active command, and the ZQ calibration command are recognized when both the chip selection signal '/CS' and the low address strobe signal '/RAS' are at the low level or when both the chip selection signal '/CS' and the write enable signal '/WE' are at the low level.

Accordingly, the control signal generating section 100 can be configured to enable the control signal 'ctrl' to the high level when both the chip selection signal '/CS' and the low address strobe signal '/RAS' are at the low level or when both the chip selection signal '/CS' and the write enable signal '/WE' are at the low level.

In FIGS. 2 and 3, the control signal generating section 100 can enable the decoding signal 'dec' to the low level when both the chip selection signal '/CS' and the low address strobe signal '/RAS' are at the low level or when both the chip selection signal '/CS' and the write enable signal '/WE' are at the low level. When the decoding signal 'dec' is enabled to the low level, a pulse signal 'pulse' enabled to the high level can be generated and the combination signal 'com' of the low level can be generated in response to the pulse signal 'pulse'. The combination signal 'com' of the low level can be inverted and output as the control signal 'ctrl' enabled to the high level.

In FIGS. 2-4, the clock control section 200 can output the clock signal 'CLK' as the control clock signal 'CLK_ctrl' when the control signal 'ctrl' is enabled to the high level, and the address latch section 300 can output the address signal 'add' as the latch signal 'latch_s' in response to the control clock signal 'CLK_ctrl'.

Accordingly, the address latch circuit 2 of the semiconductor memory apparatus is capable of reducing power consumption generated by elements that are turned ON and OFF in response to the clock signals by fixing the clock signals to a predetermined level when the all-bank precharge command is input and all the banks are precharged. The address latch circuit 1 of the semiconductor memory apparatus can be configured to normally operate by unlocking the clock signals to transition the clock signal fixed to the predetermined level when the mode register setting command, the refresh command, the active command, and the ZQ calibration command are input. When the control signal generating section 100 and the clock control section 200, as shown in FIG. 2, are integrated in one block, the one block may be called a transition control section. Here, the clock control section 200 can output a transitioned signal or a signal fixed to a predetermined level by an output of the control signal generating section 100.

While certain embodiments have been described above, it will be understood that the embodiments described are by way of example only. Accordingly, the device and methods described herein should not be limited based on the described embodiments. Rather, the device and methods described herein should only be limited in light of the claims that follow when taken in conjunction with the above description and accompanying drawings.

What is claimed is:

1. An address latch circuit of a semiconductor memory apparatus, comprising:
   a control signal generating section configured to generate a control signal in response to an external command signal and a RAS idle signal;
   a clock control section configured to output a clock signal as a control clock signal when the control signal is enabled and to fix the control clock signal to a predetermined level when the control signal is disabled; and
   an address latch section configured to latch an address signal in response to the control clock signal,
   wherein the RAS idle signal is enabled when an all-bank precharge command signal is input.

2. The address latch circuit of claim 1, wherein the external command signal is generated in a chip selection signal, a low address strobe signal, and a write enable signal.

3. The address latch circuit of claim 1, wherein the control signal generating section disables the control signal when the RAS idle signal is enabled.

4. The address latch circuit of claim 3, wherein the control signal generating section enables the control signal when both the chip selection signal and the low address strobe signal are enabled.

5. The address latch circuit of claim 4, wherein the control signal generating section includes:
   a decoding unit configured to generate a decoding signal by decoding the chip selection signal, the low address strobe signal, and the write enable signal;
   a pulse generating unit configured to generate a pulse signal when the decoding signal is enabled; and
   a signal combining unit configured to enable the control signal when the pulse is disabled and the RAS idle signal is enabled, and disabling the control signal when the pulse signal is enabled.

6. The address latch circuit of claim 5, wherein the control signal generating unit further includes:

an initialization unit configured to disable the control signal in response to a power-up signal; and a latch unit configured to latch the control signal.

7. The address latch circuit of claim 3, wherein the control signal generating unit enables the control signal when both the chip selection signal and the write enable signal are enabled.

8. The address latch circuit of claim 7, wherein the control signal generating section includes:

a decoding unit configured to generate a decoding signal by decoding the chip selection signal, the low address strobe signal, and the write enable signal;

a pulse generating unit configured to generate a puke when the decoding signal is enabled; and a signal combining unit configured to enable the control signal when the pulse is disabled and the RAS idle signal is enabled, and to disable the control signal when the pulse is enabled.

9. The address latch circuit of claim 8, wherein the control signal generating unit further includes:

an initialization unit configured to disable the control signal in response to a power up signal; and a latch unit configured to latch the control signal.

10. A semiconductor memory apparatus, comprising:

a transition control section configured to fix a clock signal to a predetermined level to output the fixed clock signal as a control clock signal when an all-bank precharge command is input; and an address latch section configured to latch an address signal in response to an output of the transition control section, wherein the transition control section outputs the clock signal as the clock signal when a mode register setting command signal, a refresh command signal, an active command signal, and a ZQ calibration command signal are input.

11. The semiconductor memory apparatus of claim 10, wherein the transition control section includes:

a control signal generating unit configured to generate a control signal in response to a RAS idle signal, a chip selection signal, a low address strobe signal, and a write enable signal; and a clock control unit configured to generate the control clock signal in response to the control signal and the clock signal.

12. The semiconductor memory apparatus of claim 11, wherein the control signal generating unit disables the control signal when the RAS idle signal is enabled.

13. The semiconductor memory apparatus of claim 12, wherein the control signal generating unit enables the control signal when both the chip selection signal and the low address strobe signal are enabled.

14. The semiconductor memory apparatus of claim 12, wherein the control signal generating unit enables the control signal when both the chip selection signal and the write enable signal are enabled.

15. The semiconductor memory apparatus of claim 11, wherein the clock control unit outputs the clock signal as the control signal when the control signal is enabled.

16. The semiconductor memory apparatus of claim 15, wherein the clock control unit fixes the control signal to the predetermined level when the control signal is disabled.

17. An address latch circuit of a semiconductor memory apparatus, comprising:

a decoding unit generating a decoding signal by decoding a chip selection signal, a low address strobe signal, and a write enable signal;

a pulse generating unit generating a pulse signal when the decoding signal is enabled;

a signal combining unit enabling a control signal when the pulse signal is disabled and an RAS idle signal is enabled, and to disable the control signal when the pulse signal is enabled;

an initialization unit disabling the control signal in response to a power-up signal;

a latch unit latching the control signal;

a clock control section configured to output a clock signal as a control clock signal when the control signal is enabled and to fix the control clock signal to a predetermined level when the control signal is disabled; and an address latch section configured to latch an address signal in response to the control clock signal, wherein the RAS idle signal is enabled when an all-bank precharge command signal is input.

18. The address latch circuit of claim 17, wherein the control signal is disabled when the RAS idle signal is enabled.

19. The address latch circuit of claim 17, wherein the control signal is enabled when both a chip selection signal and a low address strobe signal are enabled.

20. The address latch circuit of claim 17, wherein the control signal is enabled when both a chip selection signal and a write enable signal are enabled.

* * * * *